(12) United States Patent
Robinson et al.

(10) Patent No.: US 11,474,430 B2
(45) Date of Patent: *Oct. 18, 2022

(54) MULTIPLE TRIGGER MONOMER CONTAINING PHOTORESIST COMPOSITIONS AND METHOD

(71) Applicants: Alex Philip Graham Robinson, Birmingham (GB); Alexandra McClelland, Worcestershire (GB); Andreas Frommhold, Dera (DE); Dongxu Yang, Sichuan (CN); John Roth, Cohasset, MA (US); David Ure, Wellesley, MA (US)

(72) Inventors: Alex Philip Graham Robinson, Birmingham (GB); Alexandra McClelland, Worcestershire (GB); Andreas Frommhold, Dera (DE); Dongxu Yang, Sichuan (CN); John Roth, Cohasset, MA (US); David Ure, Wellesley, MA (US)

(73) Assignee: IRRESISTIBLE MATERIALS LTD, Birmingham (GB)

( * ) Notice: Subject to any disclaimer, the term of this patent is extended or adjusted under 35 U.S.C. 154(b) by 208 days.

This patent is subject to a terminal disclaimer.

(21) Appl. No.: 15/687,449

(22) Filed: Aug. 26, 2017

(65) Prior Publication Data
US 2019/0137876 A1    May 9, 2019

(51) Int. Cl.
*G03F 7/004* (2006.01)
*G03F 7/038* (2006.01)
(Continued)

(52) U.S. Cl.
CPC .......... *G03F 7/0045* (2013.01); *G03F 7/0046* (2013.01); *G03F 7/038* (2013.01);
(Continued)

(58) Field of Classification Search
CPC ....... G03F 7/038; G03F 7/0382; G03F 7/0045
(Continued)

(56) References Cited

U.S. PATENT DOCUMENTS

9,122,156 B2 *  9/2015  Robinson .............. G03F 7/0382
9,229,322 B2 *  1/2016  Robinson ............. C07D 487/14
(Continued)

*Primary Examiner* — John S Chu
(74) *Attorney, Agent, or Firm* — James G. Shelnut; The Patent Practice of Szmanda & Shelnut LLC (57) ABSTRACT

The present disclosure relates to novel multiple trigger monomer containing negative working photoresist compositions and processes. The processes involve removing acid-labile protecting groups from crosslinking functionalities in a first step and crosslinking the crosslinking functionality with an acid sensitive crosslinker in a second step. The incorporation of a multiple trigger pathway in the resist catalytic chain increases the chemical gradient in areas receiving a low dose of irradiation, effectively acting as a built in dose depend quencher-analog and thus enhancing chemical gradient and thus resolution, resolution blur and exposure latitude. The photoresist compositions utilize novel monomers and mixtures of novel monomers. The methods are ideal for fine pattern processing using, for example, ultraviolet radiation, beyond extreme ultraviolet radiation, extreme ultraviolet radiation, X-rays and charged particle rays.

13 Claims, 3 Drawing Sheets

(51) Int. Cl.
  *G03F 7/40*   (2006.01)
  *G03F 7/039*  (2006.01)
  *G03F 7/32*   (2006.01)
  *G03F 7/16*   (2006.01)
  *G03F 7/20*   (2006.01)
  *G03F 7/38*   (2006.01)

(52) U.S. Cl.
  CPC ............ *G03F 7/039* (2013.01); *G03F 7/0382* (2013.01); *G03F 7/0392* (2013.01); *G03F 7/162* (2013.01); *G03F 7/168* (2013.01); *G03F 7/2004* (2013.01); *G03F 7/2037* (2013.01); *G03F 7/322* (2013.01); *G03F 7/38* (2013.01); *G03F 7/40* (2013.01)

(58) Field of Classification Search
  USPC ...................................................... 430/270.1
  See application file for complete search history.

(56) References Cited

U.S. PATENT DOCUMENTS

| | | | |
|---|---|---|---|
| 9,519,215 B2* | 12/2016 | Robinson | G03F 7/0382 |
| 10,095,112 B2* | 10/2018 | Robinson | G03F 7/0226 |
| 2003/0224298 A1* | 12/2003 | Kobayashi | C07C 317/28 |
| | | | 430/313 |
| 2007/0212638 A1* | 9/2007 | Abdallah | C08G 75/20 |
| | | | 430/270.1 |
| 2008/0153035 A1* | 6/2008 | Abdallah | C08G 75/20 |
| | | | 430/286.1 |
| 2010/0178617 A1* | 7/2010 | Hatakeyama | G03F 7/0392 |
| | | | 430/323 |
| 2020/0272050 A1* | 8/2020 | Robinson | G03F 7/0392 |

\* cited by examiner

MULTIPLE TRIGGER MONOMER CONTAINING PHOTORESIST COMPOSITIONS AND METHOD

REFERENCE TO PRIOR FILED APPLICATIONS

The present application is a continuation-in-part, and claims the benefit under 35 U.S.C. § 120, of U.S. patent application Ser. No. 15/441,919 filed on 24 Feb. 2017, entitled "Multiple Trigger Photoresist Compositions and Methods," which application is incorporated by reference herein in its entirety.

FIELD OF INVENTION

The present invention relates to novel negative-type photoresist compositions and methods of using them. The invention further relates to multiple trigger photoresist processes which allow for improvement in contrast, resolution, and/or line edge roughness in some systems without giving up sensitivity. The compositions contain polymers, oligomers, resins and monomers which contain crosslinking functionalities that are protected with acid labile protecting groups wherein photoacid generated acid removes the protecting group to provide the now active crosslinking functionality. In a second step, the crosslinking functionality reacts with a crosslinker in the presence to the photo generated acid. In particular novel monomers are used in the compositions. The photoresist compositions and the methods of the current disclosure are ideal for fine pattern processing using, for example, ultraviolet radiation, extreme ultraviolet radiation, beyond extreme ultraviolet radiation, X-rays and charged particle rays exposure.

BACKGROUND

As is well known in the industry, the manufacturing process of various kinds of electronic or semiconductor devices such as ICs, LSIs and the like involves a fine patterning of a resist layer on the surface of a substrate material such as a semiconductor silicon wafer. This fine patterning process has traditionally been conducted by the photolithographic method in which the substrate surface is uniformly coated with a positive or negative tone photoresist composition to form a thin layer of the photoresist composition and selectively irradiating with actinic rays (such as ultraviolet light) through a photomask followed by a development treatment to selectively dissolve away the photoresist layer in the areas exposed or unexposed, respectively, to the actinic rays leaving a patterned resist layer on the substrate surface. The thus obtained patterned resist layer is utilized as a mask in the subsequent treatment on the substrate surface such as etching, plating, chemical vapor deposition and the like. The fabrication of structures with dimensions of the order of nanometers is an area of considerable interest since it enables the realization of electronic and optical devices which exploit novel phenomena such as quantum confinement effects and allows greater component packing density. Thus, the resist layer is required to have an ever-increasing fineness. One method which can be used to accomplish this is by using actinic rays having a shorter wavelength than the conventional ultraviolet light, such as, for example, electron beams (e-beams), excimer laser beams, EUV, BEUV and X-rays, used as the short wavelength actinic rays. Needless to say, the minimum size obtainable is primarily determined by the performance of the resist material and the wavelength of the actinic rays. Various materials have been proposed as suitable resist materials.

Many positive photoresists they generally apply a technique called "chemical amplification" to the polymeric resist materials. A chemically amplified resist material is generally a multi-component formulation in which there is a main polymeric component, such as a novolac resin which contributes towards properties such as resistance of the material to etching, mechanical stability and developability; and one or more additional components which impart desired properties to the resist and a photoacid generator. Typically, a portion of the hydroxy groups of a phenolic polymer, such as a novolac, a polyhydroxystyrene and the like, is protected by a functional group which reacts with an acid and is removed to de-protect the hydroxy group making the hydroxy group available for other reactions, which in positive photoresists is developability. By definition, the chemical amplification occurs through a catalytic process involving the sensitizer which results in a single irradiation event causing a cascading effect by reacting with multiple functional groups of the protected novolac molecules. In a typical example, the resist comprises a polymer and a photoacid generator (PAG) as sensitizer. The PAG releases a proton in the presence of actinic radiation (light or e-beam). This proton then reacts with the polymer to cause it to lose the functional group thus deprotecting the hydroxy group. In the process, a second proton is generated which can then react with a further molecule.

Many negative photoresists rely on photogenerated acid to cause either crosslinking or polymerization of the resist components so that the exposed areas are insoluble to developers, either solvent or aqueous based, particularly aqueous base developers. The process for these resists generally require a heating step to efficiently and effectively cause the reactions, polymerization or crosslinking, to occur since at room temperature there is not enough polymerization or crosslinking to make the resist impervious to the developer. Most of these negative working resists also require a post bake to further cure the remaining resist patterns.

Negative photoresists have also been described which combine chemically amplified positive resist chemistry with negative working curing agents, such as crosslinkers. In these photoresists, a phenolic polymer, whose hydroxy groups are partially protected, is combined with a crosslinker and a photoacid generator. During exposure, the protected hydroxy groups are de-protected and free to react with the crosslinking groups, see for example, U.S. Pat. No. 6,114,082 to Hakey. In that disclosure, the phenolic polymer is required to be partially protected (75% protection) so that, after exposure, an aqueous base developer can solubilize the unexposed areas thus allowing a negative image to remain. Also disclosed is the requirement that post exposure heating be performed to properly cure the resist to prevent the developer from attacking the exposed areas of the resist. The speed of the curing reaction can be controlled, for example, by heating the resist film after exposure (post exposure bake or PEB) to drive the reaction that causes the loss of the functional group and/or the crosslinking/curing. Also during heating, the reacted polymer molecules are free to react with remaining components of the formulation, as would be suitable for a negative-tone resist. As mentioned these systems require heating of the resist to complete the required crosslinking so that the exposed areas are insoluble to the developer.

A well-known and documented issue with chemically amplified resists is a phenomenon known as "resist blur" or "dark reaction". In the process, the photogenerated acid migrates away from the exposed areas (acid migration) and into the unexposed areas where it can cause unwanted reactions. In positive resists, line sharpening results and in negative resists line-broadening results. Various methods and resist components have been introduced to control acid diffusion such as the addition of base quenchers which react with diffused acid to remove it from the system prior to any unwanted resist reactions. Addition of base quencher itself bring limitation such as reduced sensitivity, developer issues, etc. Additionally, since most resists require PEB the increased temperature impart higher kinetic energy to the system and thus the acid resulting in increased levels of migration and thus line broadening. In some cases, where small critical dimensions (CD) are required, the exposure latitude of these systems is severely reduced including line bridging and poor resolution.

As can be seen there is an ongoing desire to obtain finer and finer resolution of photoresists that will allow for the manufacture of smaller and smaller semiconductor devices in order to meet the requirements of current and further needs. In order to achieve these lofty goals line broadening and line edge roughness need to be reduced, as well as exposure latitude and contrast need to be improved. It is thus desirable to create materials, compositions and methods which can be used in conjunction with these photoresist processes to create these improvements.

SUMMARY OF THE DISCLOSURE

In a first embodiment, a multiple trigger negative-working photoresist composition is disclosed comprising a) at least one polymer, oligomer, resin or monomer, each comprising two or more crosslinkable functionalities, wherein essentially all the functionalities are attached to acid labile protecting groups, b) at least one acid activated crosslinker, and c) at least one photoacid generator.

In a second embodiment, the multiple trigger photoresist composition of the above embodiment is disclosed, wherein the monomer is one or more of the compounds of the structure (I), (II), (III) and (IV), described infra, wherein X and Y is the same or different and each comprise crosslinkable functionalities with acid labile protecting groups attached to the functionalities, wherein R1, R2, R3 and R4 is the same or different and is a branched or unbranched, substituted or unsubstituted, saturated or unsaturated divalent alkyl chain of 1-16 carbon atoms with or without one or more heteroatoms substituted into the chain, a substituted or unsubstituted aromatic group, a heteroaromatic group, a fused aromatic or fused heteroaromatic group, an aralkyl group, a cycloaliphatic group, or a cyclic, bicyclic, or multicyclic ring formed when any 2 or more of R1, R2, R3 and R4 covalently attach to each other.

In a third embodiment, the multiple trigger photoresist compositions of any of the above embodiments are disclosed, wherein at least one of X or Y comprises wherein j, k, p, and q take the values in the table:

| -alkyl- j | -aryl- k | —O— p | —COO— q |
|---|---|---|---|
| 1 | 1 | 1 | 1 |
| 1 | 1 | 0 | 1 |
| 1 | 1 | 1 | 0 |
| 1 | 0 | 0 | 1 |
| 1 | 0 | 1 | 0 |
| 0 | 1 | 1 | 1 |
| 0 | 1 | 0 | 1 |
| 0 | 1 | 1 | 0 |
| 0 | 0 | 0 | 1 | wherein alkyl is a branched or unbranched, substituted or unsubstituted, saturated or unsaturated divalent alkyl chain of 1-16 carbon atoms with or without one or more heteroatoms substituted into the chain, aryl is a substituted or unsubstituted aromatic group, a heteroaromatic group, or a fused aromatic or fused heteroaromatic group, and wherein ALPG is a leaving group, and can be a tertiary alkyl or tertiary cycloalkyl group, an alicyclic group, a ketal or cyclic aliphatic ketal, or an acetal.

In a fourth embodiment, the multiple trigger photoresist compositions of any of the above embodiments are disclosed further comprising at least one photoacid generator comprises an onium salt compound, a sulfonium salt, a triphenylsulphonium salt, a sulfonimide, a halogen-containing compound, a sulfone, a sulfone imide, a sulfonate ester, a quinone-diazide, a diazomethane, an iodonium salt, an oxime sulfonate, a dicarboxyimidyl sulfate ester, an ylideneaminooxy sulfonic acid ester, a sulfonyldiazomethane, or a mixture thereof which are capable of generating an acid when exposed to at least one of UV, deep UV, extreme UV, x-ray, or e-beam actinic radiation at least one acid activated crosslinker comprises an aliphatic, aromatic or aralkyl monomer, oligomer, a resin or polymer, comprising at least one of a glycidyl ether, glycidyl ester, an oxetane, a glycidyl amine, a methoxymethyl group, an ethoxy methyl group, a butoxymethyl group, a benzyloxymethyl group, dimethylamino methyl group, diethylamino methyl amino group, a dialkylolmethyl amino group, a dibutoxymethyl amino group, a dimethylolmethyl amino group, diethylolmethyl amino group, a dibutylolmethyl amino group, a morpholinomethyl group, acetoxymethyl group, benzyloxymethyl group, formyl group, acetyl group, vinyl group or an isopropenyl group and a solvent, wherein the solvent comprises an ester, an ether, an ether-ester, a hydroxy ester, a hydroxy ether, a ketone, a keto-ester, a hydrocarbon, an aromatic compound, a halogenated solvent, an alkyl-aryl ether or a combination thereof.

In a fifth embodiment, the multiple trigger photoresist compositions of any of the above embodiments are disclosed, wherein the acid-labile protecting group is capable of being removed when exposed to a photogenerated acid and optionally during a post exposure baking process, providing a functionality capable of crosslinking with the crosslinker when the crosslinker is exposed to the photogenerated acid.

In a sixth embodiment, the multiple trigger photoresist compositions of any of the above embodiments are disclosed wherein the monomer is one more of compound (V), (VI), VII) and (VIII) described infra.

In a seventh embodiment, methods of forming a patterned resist layer on a substrate are disclosed comprising the steps of: a) providing a substrate, b) applying any one of the multiple trigger negative working photoresist compositions of the above embodiments, c) heating the coated substrate to form a substantially dried coating to obtain a desired thickness, d) imagewise exposing the coated substrate to actinic radiation chosen from one or more of UV, deep UV, extreme UV, x-ray, or e-beam actinic radiation, and e) removing the unexposed areas of the coating using an aqueous solvent, an organic solvent or a combination aqueous-solvent developer composition, wherein the remaining photoimaged pattern is optionally heated.

In a seventh embodiment, methods of the above embodiment of forming a patterned resist layer on a substrate are disclosed wherein the acid labile protecting group is capable of being removed when exposed to acid under ambient conditions providing a functionality capable of crosslinking with the crosslinking system when the crosslinking system is catalyzed by acid, wherein the acid labile protecting group comprises a tertiary alkoxycarbonyl group.

In an eighth embodiment, methods of the above embodiments of forming a patterned resist layer on a substrate are disclosed wherein the at least one photoacid generator comprises an onium salt compound, a triphenylsulphonium salt, a sulfonimide, a halogen-containing compound, a sulfone, a sulfonate ester, a quinone-diazide, a diazomethane, an iodonium salt, an oxime sulfonate, or a dicarboxyimidyl sulfate, wherein the at least one acid activated crosslinker comprises a monomer, resin, oligomer or polymer, comprising at least one of a glycidyl ether, glycidyl ester, glycidyl amine, a methoxymethyl group, an ethoxy methyl group, a butoxymethyl group, a benzyloxymethyl group, dimethylamino methyl group, diethylamino methyl amino group, a dialkylolmethyl amino group, a dibutoxymethyl amino group, a dimethylolmethyl amino group, diethylolmethyl amino group, a dibutylol methyl amino group, a morpholino methyl group, acetoxymethyl group, benzyloxy methyl group, formyl group, acetyl group, vinylgroup, an isopropenyl group, or one or more glycidyl ether groups attached to an aryl monomer, oligomer or polymer.

In a ninth embodiment, methods of the above embodiments of forming a patterned resist layer on a substrate are disclosed wherein the multiple trigger negative working photoresist composition contains the monomer is one more of compound (V), (VI), VII) and (VIII) described infra In a further embodiment, compositions and methods of the above embodiments are disclosed comprising a mixture of monomers with structures I-VIII.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As used herein the phrase "acid labile protecting group (ALPG)" refers to a group which is attached to a crosslinkable functionality and has the property of reacting with an acid to result in its removal and thus deprotecting a crosslinking functionality to which it was bound, allowing the crosslinking functionality to crosslink with a crosslinker in a second step. An ALPG may be comprised of one or more parts including, for example, leaving group (LG). In some cases the leaving group with leave behind an unstable intermediate such intermediate further decomposes and "leaves" resulting in the now unprotected crosslinking functionality.

As used herein, the terms "dry", "dried" and "dried coating" means having less than 8% residual solvent.

As used herein the phrase "essentially all" means at least 90%.

The current disclosure describes a multiple trigger negative-working photoresist composition comprising a) at least one polymer, oligomer, resin or monomer, each comprising two or more crosslinkable functionalities, wherein essentially all the functionalities are attached to acid labile protecting groups, b) at least one acid activated crosslinker, and c) at least one photoacid generator. It has surprisingly been found that when essentially all the crosslinkable functionalities of a polymer, oligomer, a resin or a monomer are attached to acid labile protecting groups in combination with acid activated crosslinkers, a major improvement in resolution, resolution blur, exposure latitude with tunable sensitivity when processed, via what is believed to be a multiple trigger negative working resist process as will be described below.

The crosslinkable functionalities used in negative working photoresists are well known in the industry and include, for example, hydroxy, amino, oximes, and the like. The functionalities in the presence of acid and an acid activated crosslinker will react to crosslink. These functional groups can be attached to a ballast group such as an alkyl group, an aryl group, or an aralkyl group. Such aryl groups useful for the current disclosure include, for example, a substituted or unsubstituted divalent aromatic group, such aromatic groups include, for example the phenylenes ($-C_6H_4-$), the fused divalent aromatic group, such as, for example, the naphthylenes ($-C_{10}H_6-$), the anthracenylenes ($-C_{14}H_8-$) and the like, as well as the heteroaromatic groups, such as, for example, the nitrogen heterocycles: pyridines, quinolines, pyrroles, indoles, pyrazoles, the triazines, and other nitrogen-containing aromatic heterocycles well known in the arts, as well as the oxygen heterocycles: furans, oxazoles and other oxygen-containing aromatic heterocycles, as well the sulfur containing aromatic heterocycles, such as, for example, thiophenes. Trivalent and tetravalent aromatics can also be used.

Such alkyl groups useful for the current disclosure include, for example, branched or unbranched, substituted or unsubstituted, saturated or unsaturated divalent alkyl chain of 1-16 carbon atoms having 0-16 heteroatoms substituted into the chain.

The aryl groups may be in the form of an oligomer, a polymer, or a resin or a monomer with a molecular weight between about 100 daltons and 100,000 daltons and higher depending on the desired properties of the cured negative resist pattern, such as etch resistance.

Examples of polymers or oligomers include the novolac resins based on phenol, the cresols, the resorcinols, the pyrogallols and the like which also include co-polymers made therefrom. Also, polyhydroxystyrene based polymers and their derivatives or co-polymers may be used in these photoresist compositions.

The crosslinkable functionalities are blocked, or protected, by acid labile protecting groups. Acid labile protecting groups including, for example, substituted methyl groups, silyl groups, germyl groups, alkoxycarbonyl acid labile protecting groups including, for example, the methoxycarbonyl group, ethoxy carbonyl group, isopropoxy carbonyl group and t-butoxycarbonyl group, carboxylic ester groups, ester groups based on sulfur, vinyl groups, ketals, acetals, and the like, including, for example, a tert-butyl group, a tert-pentyl group, a 2,3-dimethylbutan-2-yl group, a 2,3,3-trimethylbutan-2-yl group, a 2,3-dimethylpentan-3-yl group, a 2-methylbicyclo[2.2.1]heptan-2-yl group, a bicyclo[2.2.1]heptan-2-yl group, a 1-methylcyclopentyl group, a 1-ethylcyclopentyl group, a 1-methylcyclohexyl group, a 1-ethylcyclohexyl group, a 2-methyladamantyl group or a 2-ethyladamantyl group.

Acid activated crosslinkers suitable for the current disclosure constitute compounds able to crosslink with the crosslinkable functionalities mentioned above during the process such that when deprotected to provide for example, a phenol or similar group, the crosslinker will react with the now deprotected —OH or similar group situated on the phenol or similar group. The crosslinkers may be a polymer, an oligomer, a resin or a monomer. Not to be held to theory, it is believed that the acid that is generated by exposure to the actinic radiation not only reacts with the acid-labile protecting group of the polymer, oligomer or monomer, as the first trigger, but aids in the reaction of the crosslinker with the crosslinkable functionality as the second trigger to cause a curing reaction. Such curing reaction decreases the developer solubility of the exposed and now reacted areas to result in a pattern of cured material. Examples of crosslinkers include compounds comprising at least one type of substituted group that possess a cross-linking reactivity with a hydroxy group, such as from a phenol, an amine or similar group of the polymer, oligomer, resin or monomer.

Specific examples of the acid activated crosslinker include the glycidyl ether group, glycidyl ester group, glycidyl amino group, methoxymethyl group, ethoxy methyl group, benzyloxymethyl group, dimethylamino methyl group, diethylamino methyl group, dimethylol amino methyl group, diethylol amino methyl group, morpholino methyl group, acetoxymethyl group, benzyloxy methyl group, formyl group, acetyl group, epoxy group, vinyl group and isopropenyl group.

The photo acid generators (PAGs) suitable for the multiple trigger negative working photoresist of the current disclosure include onium salt compounds, sulfone imide compounds, halogen-containing compounds, sulfone compounds, ester sulfonate compounds, quinonediazide compounds, and diazomethane compounds.

The compositions of the current disclosure may contain one or more of the above mentioned photoacid generators.

Examples of suitable solvents for the current disclosure include ethers, esters, alcohols, etheresters, ketones, lactones, ketoesters, and the like.

Various additives may be added to the photoresist formulations to provide certain desirable characteristic of the photoresist such as, for example, acid diffusion control agents to retard acid from migrating into unexposed areas of the coating, surfactants to improve coating of substrates, adhesion promoters to improve adhesion of the coating to the substrate and sensitizers to improve the photosensitivity of the photoresist coating during photoexposure, and antifoaming agents and air release agents, as well as other materials well know in the coatings industry.

The crosslinkable functionalities are all blocked by the acid labile protecting groups from about 90% to about 100% blocked. The acid labile groups have the well-known property of having the capability of being removed when exposed to acid and optionally heat.

The components of the compositions of the current disclosure are included in ranges as follows based on weight/weight: the protected polymer, oligomer, resin or monomer from about 1% to about 65%, acid activated crosslinker from about 10% to about 80%, photoacid generator from about 0.5% to about 50%. The percent solids of the composition may range from about 0.001%—about 25%.

It has surprisingly been found that certain monomers can be formulated into the currently disclosed multiple trigger negative-working photoresist compositions with excellent results. Such monomers include esters, wherein the ester is a product of a chemical reaction between a malonate ester and an amidine in the presence of a suitable halogen donor or pseudohalogen donor:

malonate ester      amidine wherein X and Y is the same or different and each comprise crosslinkable functionalities with acid labile protecting groups attached to the functionalities, wherein R1, R2, R3 and R4 is the same or different and is a branched or unbranched, substituted or unsubstituted, saturated or unsaturated divalent alkyl chain of 1-16 carbon atoms with or without one or more heteroatoms substituted into the chain, a substituted or unsubstituted aromatic group, a heteroaromatic group, a fused aromatic or fused heteroaromatic group, an aralkyl group, a cycloaliphatic group, or a cyclic, bicyclic, or multicyclic ring formed when any 2 or more of R1, R2, R3 and R4 covalently attach to each other and may be fused as shown below:

wherein m=1-4 and n=1-4.

Disclosed herein are multiple trigger negative-working photoresist compositions comprising: at least one monomeric ester, having the generic structure chosen from (I), (II), (III) or (IV); at least one photo acid generator; at least one crosslinker; and at least one solvent; wherein X and Y is the same or different and each comprise crosslinkable functionalities with acid labile protecting groups attached to the functionalities, wherein R1, R2, R3 and R4 is the same or different and is a branched or unbranched, substituted or unsubstituted, saturated or unsaturated divalent alkyl chain of 1-16 carbon atoms with or without one or more heteroatoms substituted into the chain, a substituted or unsubstituted aromatic group, a heteroaromatic group, a fused aromatic or fused heteroaromatic group, an aralkyl group, a cycloaliphatic group, or a cyclic, bicyclic, or multicyclic ring formed when any 2 or more of R1, R2, R3 and R4 covalently attach to each other and may be fused:

In the above, the group —N=R3' is used here to denote an amine which is double bonded to an R3 moiety.

Further disclosed herein are multiple trigger negative-working photoresist compositions comprising a monomeric ester, having a structure chosen from (V), (VI), (VII), or (VIII) wherein at least one of X and Y comprises an acid labile group and wherein m=1-4 and wherein n=1-4.

In the above disclosed structures, I-VIII, at least one of X or Y may comprise an acid labile protecting group, such that X or Y has the general structure -E-O$_p$—COO-LG which may or may not comprise an extender chain, -E-. In addition, the acid labile protecting group may comprise a carbonate (for which p=1) or a carboxylate (for which p=0), and a leaving group, LG. In the case of the carbonate esters, the ALPG group is a combination of a LG and CO$_2$ which both are eliminated during the deprotection reaction, leaving behind an OH group. In the case of the carboxylate esters, the ALPG is only the ester moiety which is eliminated, leaving behind a carboxylic acid. In certain circumstances, the carboxylic acid may be eliminated via decarboxylation using a base. As an example, either or both of X and Y may comprise a structure such as -alkyl-aryl-(O)$_p$—COO-LG wherein p=0 or 1, wherein the portion, -alkyl-aryl- is an extender chain, wherein alkyl is a branched or unbranched, substituted or unsubstituted, saturated or unsaturated divalent alkyl chain of 1-16 carbon atoms with or without heteroatoms substituted into the chain, aryl is a substituted or unsubstituted divalent phenyl group, divalent heteroaromatic group, or divalent fused aromatic or fused heteroaromatic group, wherein —O—COO-LG is an acid labile protecting group which is removed when reacted with a photo generated acid. In addition to the carbonate ester, depicted above, the ALPG may comprise an acid labile carboxylic acid ester having similar leaving groups. The ALPG may be a tert-butoxycarbonate group, a tert-butoxy carboxylate group or other carbonate or carboxylate ester having a leaving group such as, without limitation, a tertiary alkyl or cycloalkyl group, an alicyclic group, a ketal or cyclic aliphatic ketal, or an acetal. In addition, the ALPG may comprise a mass persistent moiety in which p=0 and the leaving group is bonded to the extender chain.

Non-limiting examples may generally be represented by the structure and may, for example, include the following:

wherein the matter in brackets, supra, shows the presumed acidolysis reaction, wherein the points of attachment to the remainder of the group, E, are shown. Wherein R6 is a hydrogen, methyl, ethyl, or benzyl group, R7 and R8 may be the same or different and may be methyl, ethyl, or benzyl groups and q=0 to 4. Examples of mass persistent resists are known. See, for example, Klop et al., Chem. Commun., (2002), 2956-2957, and Ushirogouchi et al., Proc. SPIE, 3999, 1147, (2000).

In addition, X and Y may comprise, for example, without limitation, no extender chain, or divalent extender chains comprising -alkyl-, -aryl-, -alkyl-aryl-, -aryl-alkyl-, -alkoxy-, -alkoxy-aryl-, -aryl-alkoxy-, -alkyl-alkoxy-, -alkoxy-alkyl-, or combinations of the foregoing, wherein alkyl is a branched or unbranched, substituted or unsubstituted, saturated or unsaturated divalent alkyl chain of 1-16 carbon atoms with or without one or more heteroatoms substituted into the chain, aryl is a substituted or unsubstituted aromatic group, a heteroaromatic group, or a fused aromatic or fused heteroaromatic group, and wherein ALPG is an acid labile protecting group.

-Aryl-, above, is a substituted or unsubstituted divalent aromatic group, such aromatic groups include, for example the phenylenes (—C6H4-), the fused divalent aromatic group, such as, for example, the naphthylenes (—C10H6-), the anthacenylenes (—C14H8-) and the like, as well as the heteroaromatic groups, such as, for example, the nitrogen heterocycles: pyridines, quinolines, pyrroles, indoles, pyrazoles, the triazines, and other nitrogen-containing aromatic heterocycles well known in the arts, as well as the oxygen heterocycles: furans, oxazoles and other oxygen-containing aromatic heterocycles, as well the sulfur containing aromatic heterocycles, such as, for example, thiophenes.

Turning to the leaving groups, LG, on one of X or Y, LG may be H or D as long as the other of X or Y comprises an ALPG. ALPGs are taken to be those groups that may be removed or are removable by acidolysis, and may include, for example and without limitation, tertiary alkyl leaving groups, which have the general structure —$CR_5R_6R_7$, wherein $R_5$, R6, and R7 may be the same or different and represent linear or branched alkyl, heteroalkyl or alkyl aryl groups. Without limitation, exemplary groups may be a tert-butyl group, a tert-pentyl group, a 2,3-dimethylbutan-2-yl group, a 2,3,3-trimethylbutan-2-yl group, a 2,3-dimethylpentan-3-yl group, a 2-methylbicyclo[2.2.1]heptan-2-yl group, a bicyclo[2.2.1]heptan-2-yl group, a 1-methylcyclopentyl group, a 1-ethylcyclopentyl group, a 1-methylcyclohexyl group, a 1-ethylcyclohexyl group, a 2-methyladamantyl group or a 2-ethyladamantyl group. Further, exemplary tertiary carbon containing leaving groups may include ring structures having oxygen atoms such as a mevalonic lactone-yl group.

Acid labile protecting groups may also include, without limitation, substituted methyl groups, silyl groups, ketals and acetals.

The alkoxycarbonyl leaving groups include the methoxycarbonyl group, ethoxy carbonyl group, isopropoxy carbonyl group and t-butoxycarbonyl group. The acyl acid labile groups include, for example, the acetyl group, propionyl group, butyryl group, heptanoyl group, hexanoyl group, valeryl group, pivaloyl group, isovaleryl group, lauroyl group, myristoyl group, palmitoyl group, stearoyl group, oxaryl group, malonyl group, succinyl group, glutaryl group, adipoyl group, piperoyl group, suberoyl group, azelaoyl group, sebacoyl group, acrylyl group, propioloyl group, methacryloyl group, crotonoyl group, oleoyl group, maleoyl group, fumaroyl group, mesaconoyl group, camphoroyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluene sulfonyl group and the mesyl group.

Leaving groups may also include ring or alicyclic structures that may be removed by acidolysis such as, for example, a cyclopropyl group, cyclopentyl group, cyclohexyl group, cyclohexanyl group, 4-methoxycyclohexyl group, tetrahydropyranyl group, tetrahydrofuranyl group, tetrahydrothiopyranyl group, tetrahydrothiofuranyl group, 3-bromo tetrahydropyranyl group, 4-methoxy tetrahydropyranyl group, 4-methoxy tetrahydrothiopyranyl group and 3-tetrahydrothiophene-1,1-dioxy group.

Negative working photosensitive compositions, disclosed herein comprise an ester such as (I)-(VIII), described above, or any other product resulting from the reaction between a malonate ester, described above, and an amidine, described above, in the presence of a suitable halogen donor or pseudohalogen donor; at least one crosslinkable material; and at least one acid generator, wherein the ester takes the place of at least a portion of the resin used in conventional negative working photoresists.

The process for making the monomeric esters I-IV and V-VIII above results in mixtures of I-IV and V-VIII respectively. Separation of these resultant ester is laborious and costly as their structures are very similar and act similarly in separation schemes. It has unexpectedly been found that the compositions of the immediate disclosure using mixtures of the esters give results equal to or, in some embodiments, superior to the compositions using separated, purified esters. This results in a large savings both from costs and from yield points of view, as more can be used from the synthetic reaction and less will be lost during separation schemes. In addition, it has unexpectedly been found that the presence of similar species in a compositions tends to inhibit nucleation, aggregation, and/or crystallization, which contributes to line-edge roughness and poor film quality. Generally, the use of "purified" components is much more desirable than mixtures of material which contain what is commonly called "by-products". However, in the embodiments of the current disclosure, mixtures are unexpectedly superior.

The photoresist compositions can be coated onto a substrate such as a silicon wafer or a wafer coated with silicon dioxide, aluminum, aluminum oxide, copper, nickel, any of a number of semiconductor materials or nitrides or other substrates well known the semiconductor industry, or a substrate having thereon an organic film, such as, for example, a bottom layer anti-reflective film or the like. The photoresist compositions are applied by such processes as spin coating, curtain coating, slot coating, dip coating, roller coating, blade coating and the like. After coating, the solvent is removed to a level wherein the coating can be properly exposed. In some cases a residual of 5% solvent may remain in the coating while in other cases less than 1% is required. Drying can be accomplished by hot plate heating, convection heating, infrared heating and the like. The coating is imagewise exposed through a mark containing a desired pattern.

Radiation suitable for the described photoresist compositions include, for example, ultraviolet rays (UV), such as the bright line spectrum of a mercury lamp (254 nm), a KrF excimer laser (248 nm), and an ArF excimer laser (193 nm), extreme ultraviolet (EUV) such as 13.5 nm from plasma discharge and synchrotron light sources, beyond extreme ultraviolet (BEUV) such as 6.7 nm exposure, X-ray such as synchrotron radiation. Ion beam lithography and charged particle rays such as electron beams may also be used.

Following exposure, the exposed coated substrate may optionally be post exposure baked to enhance the reaction of the photoacid generator, such as, for example, heating from about 30 to about 200° C. for about 10 to about 600 seconds. This may be accomplished by hot plate heating, convection heating, infrared heating and the like. The heating may also be performed by a laser heating processes such as, for example, a $CO_2$ laser pulse heating for about 2 to about 5 milliseconds. Both heating processes may be combined in tandem.

A flood exposure process may optionally be applied after the pattern exposure to aid in further cure. Results have indicated that flood exposure reduces or eliminates pattern collapse after development of the negative-tone resists as well as reduction in line edge roughness. For example, a 532 nm continuous wave laser exposes the previously exposed resist for 1-2 sec followed by wet development. The flood process may or may not be followed by a heating step.

The unexposed areas are next moved using a developer. Such developers generally include organic and semi-aqueous solvents. The develop solvent is less aggressive than the solvent that was used in preparing the photoresist composition.

After development, a final baking step may be included to further enhance the curing of the now exposed and developed pattern. The heating process may be, for example, from about 30 to about 300° C. for about 10 to about 120 seconds and may be accomplished by hot plate heating, convection heating, infrared heating and the like.

Not to be held to theory, it is believed that the curing of the system involves multiple triggers, in the example below, a 2-step process wherein the protected crosslinking functionality and the crosslinker must both be exposed to an acid in order for them to react. When the PAG is exposed to actinic radiation, acid is produced which will deprotect the crosslinking functionality which is now available for crosslinking with the crosslinker only when radiation produced acid activates the crosslinker in the presence of the crosslinking functionality. Because two reactions are required it is believed that "acid migration" or "dark reaction" is quelled and resist blur is reduced and resolution and exposure latitude are significantly improved. See Scheme 1 below. In theory if a third reaction were required to cure the negative working photoresist, a further improvement in resolution blur, resolution and exposure latitude would occur.

Scheme 1

STEP 1

STEP 2

In Scheme 1 the protected crosslinkable functionality A is deprotected when in the presence of acid H+, and results in the deprotected compound B, where the functionality is —OH. The crosslinker C, in the presence of an acid, and the crosslinkable functionality can now react together to give the cured material D.

Examples below and the following discussion will demonstrate the surprising improvement of the current disclosure.

EXAMPLES USING MONOMERIC MATERIALS

Synthesis of Monomer A

Step 1:

To a 3 L round bottom flask was added 3-(4-hydroxyphenyl)-1-propanol (102.1 g, 670.9 mmol), dichloromethane (760 mL) and di-tert-butyldicarbonate (146.4 g, 670.9 mmol). The mixture was stirred under nitrogen and cooled to 0° C. in an ice bath. Potassium carbonate (250.3 g, 1811.3 mmol) and 18-crown-6 (8.9 g, 33.5 mmol) were added. The resulting mixture was stirred and warmed to room temperature overnight. The crude reaction mixture was evaporated to remove most of the solvent and the residue was purified via flash column chromatography on silica gel with ethyl acetate:Hexane (40%/60%) as eluant. The third fraction was combined together and the solvent removed to give 135.6 g (yield: 80%) of 1 as a yellow oil. The product was characterized by $^1$H NMR.

Step 2:

2

Dichloromethane (2 L) was added to 1 (135.6 g, 537.7 mmol) in a 3 L round bottom flask. To this was added, while stirring, pyridine (56.6 g, 715.1 mmol) and the solution was cooled to 0° C. in an ice bath under nitrogen. Malonyl dichloride (34.8 mL, 357.6 mmol) was added dropwise using an addition funnel. The initially clear solution became dark red upon complete addition of the malonyl dichloride. The mixture was stirred and warmed up to room temperature overnight, by which time it had become dark blue/green in color. The mixture was filtered through a silica gel plug which was rinsed with ethyl acetate. The filtrate was evaporated and the residue was purified via flash column chromatography on silica gel using 25% ethyl acetate/n-hexane as eluant. The fractions were collected and solvent was removed to give 2 as yellow oil (93.1 g, 61% yield). The product was characterized by $^1$H NMR.

Step 3

Tetrabromomethane (4.05 g, 12.2 mmol) and 2 (6.3 g, 11.0 mmol) were added to a 500 mL round bottom flask. Toluene (240 mL) was added and the mixture was stirred under nitrogen for 1 hour. 1,8-Diazabicyclo[5.4.0]undec-7-ene (DBU, 7.3 g, 48.2 mmol) was added dropwise. The reaction mixture was stirred under nitrogen for 18 hours and then filtered. The resulting mixture was purified via a silica gel column using toluene, followed by ethyl acetate and then a gradient of 20% to 50% isopropanol/ethyl acetate. The fifth fraction was collected and solvent was removed to give the final product as a light yellow solid (3.4 g). The product was characterized by $^1$H NMR and elemental analysis and $^{13}$C NMR analysis which showed that the most likely a mixture of a combination of monomers V-VIII, wherein m=2 and n=3.

Synthesis of Monomer B

Similar to Synthesis steps of monomer except that 1,5-Diazabicyclo(4.3.0)non-5-ene (DBN, 5.95 g, 48.2 mmol) was used in place of DBU. The product was characterized by $^1$H NMR $^{13}$C NMR, Moldi-TOF, crystallography and Mass Spec.

Composition Example 1

Into 100 mL of propylene glycol monomethyl ether (PGME) is added 0.25 g of Monomer A, 0.50 g of poly[(o-cresyl glycidyl ether)-co-formaldehyde] and 0.25 g of triphenylsulfonium hexafluoroantimonate. The mixture is stirred for 1 hr at room temperature and filtered through a 20 nm PTFE membrane filter, available from Pall Corporation, of Port Washington N.Y. The composition is applied to a silicon wafer and spin coated at 500 rpm for 5 sec followed by 2000 rpm for 60 sec. The coated wafer is then heated on a hot plate at 75° C. for 5 min to give a film of approximately 25 nm. The coated wafer is then imagewise exposed to synchrotron based EUV light at 13-14 nm wavelength and post exposure baked at 90° C. for 3 min. The unexposed areas are removed by puddle development in a 50:50 blend of monochlorobenzene and isopropyl alcohol for 20 sec followed by an isopropyl alcohol rinse.

Composition Example 2

The formulation and process of Composition Example 1 was used except that the material of Monomer B is used.

Composition Example 3

Figure 1:
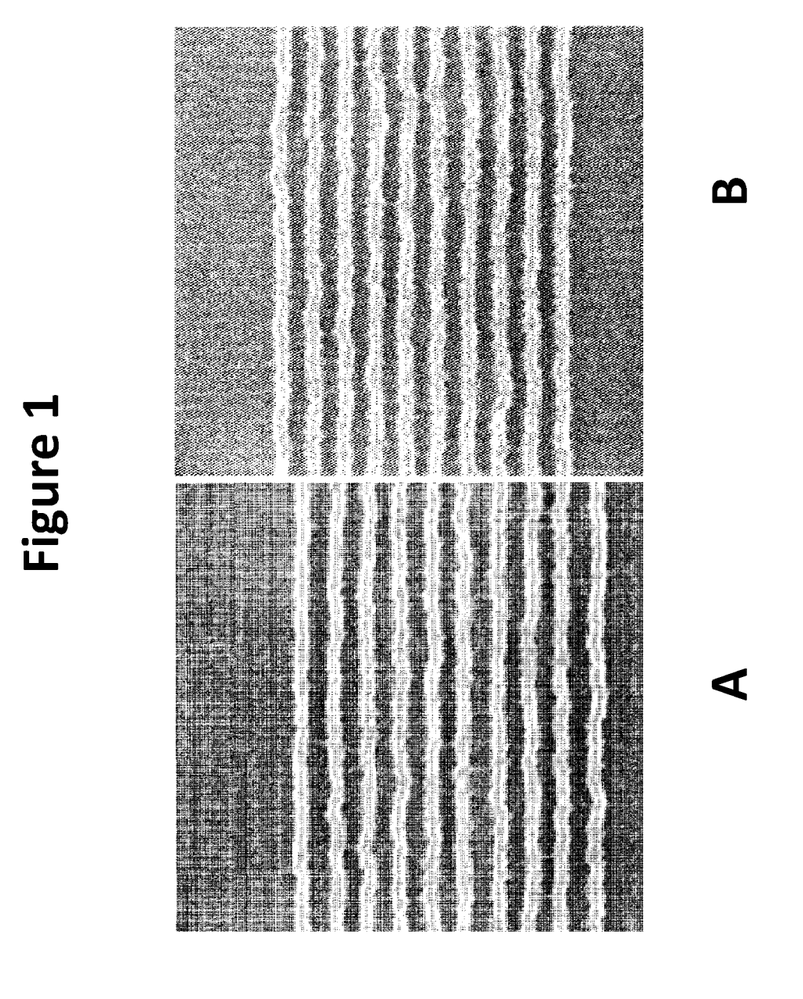
FIG. 1 shows a scanning electron micrograph of the lithographic features produced using Composition Example 3 (FIG. 3(A)), and Composition Example 4 (FIG. 3(B)), described infra.
Figure 2:
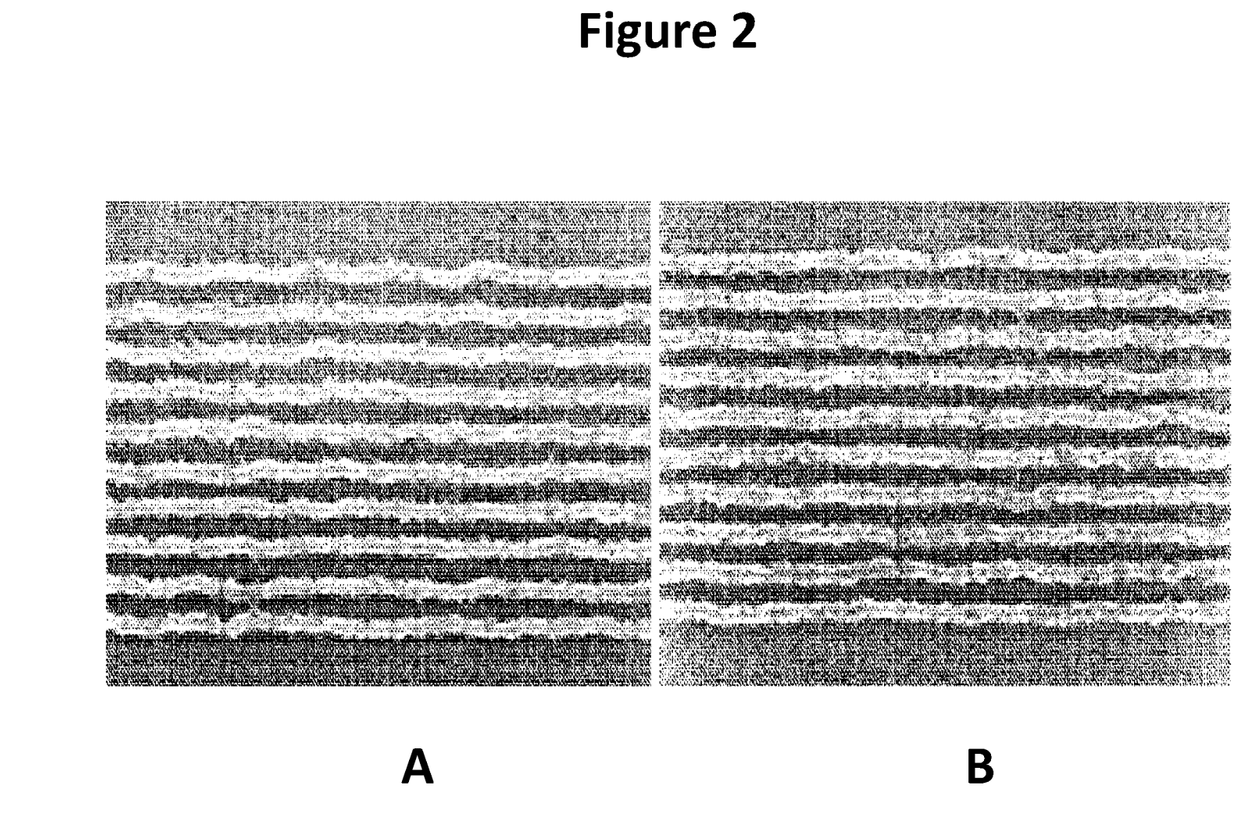
FIG. 2 shows a scanning electron micrograph of the lithographic features produced using Composition Example 5 (FIG. 4(A)), and Composition Example 6 (FIG. 4(B)), described infra.
Figure 3:
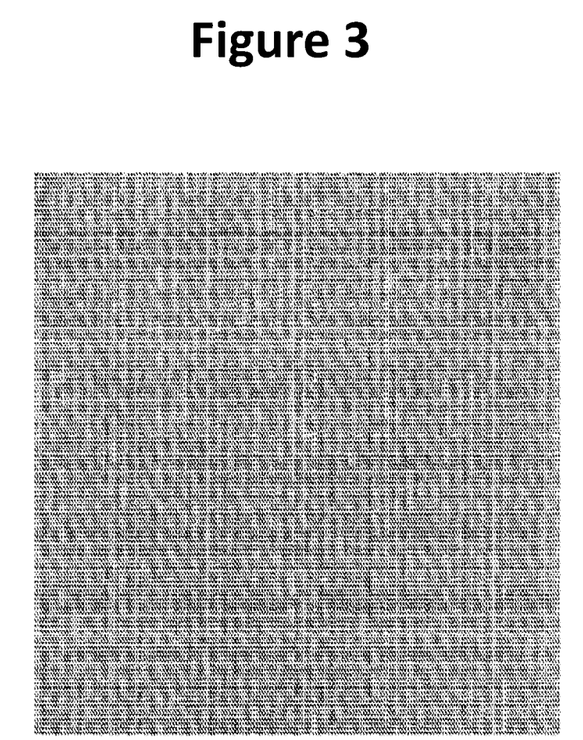
FIG. 3 shows a scanning electron micrograph of the lithographic features produced using Composition Example 7, described infra.

Into 100 mL of ethyl lactate was added 0.05 g of the product of Monomer A, 0.50 g of poly[(o-cresyl glycidyl ether)-co-formaldehyde] (Mn=1270) and 0.25 g of triphenylsulfonium hexafluoroantimonate and stirred for 1 hr at room temperature. The composition was applied to a silicon wafer and spin-coated at 500 rpm for 5 sec followed by 1500 rpm for 90 sec. The coated wafer was then heated on a hot plate at 70° C. for 5 min to give a film of approximately 25 nm. The wafer was imagewise exposed to E-beam and post exposure baked at 90° C. for 1 min. The unexposed areas were removed by puddle development in cyclohexanone for 20 sec followed by an isopropyl alcohol rinse. A line dose of 142 pC/cm was applied, given dense lines of 40 nm half pitch. FIG. 3(A) shows the resulting printed features.

Composition Example 4

Composition Example 3 was repeated using poly[(o-cresyl glycidyl ether)-co-formaldehyde] (Mn=870) in place of poly[(o-cresyl glycidyl ether)-co-formaldehyde] (Mn=1270). A line dose of 107 pC/cm was applied, given dense lines of 38 nm half pitch. FIG. 3(B) shows the resulting printed features.

Composition Example 5

Composition Example 3 was repeated adding 0.04 g of triphenylsulfonium nonaflate into resist formulation. A line dose of 117 pC/cm was applied, given dense lines of 38 nm half pitch. FIG. 4(A) shows the resulting printed features.

Composition Example 6

Composition Example 5 was repeated adding 0.008 g of 1,8-Diazabicycloundec-7-ene in the resist formulation. A line dose of 156 pC/cm was applied, given dense lines of 38 nm half pitch. FIG. 4(B) shows the resulting printed features.

Composition Example 7

Into 67.2 mL of ethyl lactate was added 0.05 g of the product of Monomer B, 0.50 g of poly[(o-cresyl glycidyl ether)-co-formaldehyde] (Mn=870), 0.04 g of triphenylsulfonium trifluoromethane sulfonate, and 0.25 g of triphenylsulfonium hexafluoroantimonate and stirred for 1 hr at room temperature. The composition was applied to a silicon wafer and spin-coated 3000 rpm for 90 sec. The coated wafer was then heated on a hot plate at 105° C. for 5 min to give a film of approximately 25 nm. The wafer was imagewise exposed using EUV light having a wavelength of about 13.4 nm, at 88 mJ/cm² dose to mask (dose to wafer estimate 8.8 mJ/cm²), and post exposure baked at 90° C. for 3 min. The unexposed areas were removed by puddle development in cyclohexanone for 30 sec followed by an isopropyl alcohol rinse, producing lines of 14 nm half pitch. FIG. 5 shows the resulting printed features.

Although the present invention has been shown and described with reference to particular examples, various changes and modifications which are obvious to persons skilled in the art to which the invention pertains are deemed to lie within the spirit, scope and contemplation of the subject matter set forth in the appended claims.

We claim:
1. A multiple-trigger, negative-working photoresist composition comprising:
   a. A polymer comprising crosslinkable functionalities, wherein the at least 90% of the crosslinkable functionalities are attached to acid-labile protecting groups,
   b. An acid activatable crosslinker,
   c. A photoacid generator or a thermal acid generator, and
   d. A monomer component with the following structure:

(I)

(II)

(III)

(IV)

wherein X and Y is the same or different and each comprise crosslinkable functionalities with acid labile protecting groups attached to the functionalities, wherein R1, R2, R3 and R4 is the same or different and is a branched or unbranched, substituted or unsubstituted, saturated or unsaturated divalent alkyl chain of 1-16 carbon atoms with or without one or more heteroatoms substituted into the chain, a substituted or unsubstituted aromatic group, a heteroaromatic group, a fused aromatic or fused heteroaromatic group, an aralkyl group, a cycloaliphatic group, or a cyclic, bicyclic, or multicyclic ring formed when any 2 or more of R1, R2, R3 and R4 covalently attach to each other.

2. The photoresist composition of claim 1, comprising a mixture of monomers with structures I-IV.

3. The photoresist composition of claim 2, wherein at least one of X or Y comprises $(alkyl)_j$-$(aryl)_k$-$(O)_p$—$(COO)_q$-ALPG wherein j, k, p, and q take the values in the following table:

| -alkyl- j | -aryl- k | —O— p | —COO— q |
|---|---|---|---|
| 1 | 1 | 1 | 1 |
| 1 | 1 | 0 | 1 |
| 1 | 1 | 1 | 0 |
| 1 | 0 | 0 | 1 |
| 1 | 0 | 1 | 0 |
| 0 | 1 | 1 | 1 |
| 0 | 1 | 0 | 1 |
| 0 | 1 | 1 | 0 |
| 0 | 0 | 0 | 1 | wherein alkyl is a branched or unbranched, substituted or unsubstituted, saturated or unsaturated divalent alkyl chain of 1-16 carbon atoms with or without one or more heteroatoms substituted into the chain, aryl is a substituted or unsubstituted aromatic group, a heteroaromatic group, or a fused aromatic or fused heteroaromatic group, and wherein ALPG is a leaving group.

4. The photoresist composition of claim 3, wherein ALPG is a tertiary alkyl or tertiary cycloalkyl group, an alicyclic group, a ketal or cyclic aliphatic ketal, or an acetal.

5. The photoresist composition of claim 2, wherein the at least one photoacid generator comprises an onium salt compound, a sulfonium salt, a triphenylsulphonium salt, a sulfonimide, a halogen-containing compound, a sulfone, a sulfone imide, a sulfonate ester, a quinone-diazide, a diazomethane, an iodonium salt, an oxime sulfonate, a dicarboxyimidyl sulfate ester, an ylideneaminooxy sulfonic acid ester, a sulfonyldiazomethane, or a mixture thereof which are capable of generating an acid when exposed to at least one of UV, deep UV, extreme UV, x-ray, or e-beam actinic radiation.

6. The photoresist composition of claim 2, wherein the at least one acid activated crosslinker comprises an aliphatic, aromatic or aralkyl monomer, oligomer, a resin or polymer, comprising at least one of a glycidyl ether, glycidyl ester, an oxetane, a glycidyl amine, a methoxyrnethyl group, an ethoxy methyl group, a butoxyrnethyl group, a benzyloxymethyl group, dimethylamino methyl group, diethylamino methyl amino group, a dialkylolmethyl amino group, a dibutoxymethyl amino group, a dimethylolmethyl amino group, diethylolmethyl amino group, a dibutylolmethyl amino group, a morpholinomethyl group, acetoxymethyl group, benzyloxymethyl group, formyl group, acetyl group, vinyl group or an isopropenyl group.

7. The photosensitive composition of claim 2, further comprising a solvent, wherein the solvent comprises an ester, an ether, an ether-ester, a hydroxy ester, a hydroxy ether, a ketone, a keto-ester, a hydrocarbon, an aromatic compound, a halogenated solvent, an alkyl-aryl ether or a combination thereof.

8. The photoresist composition of claim 2, wherein the acid-labile protecting group is capable of being removed when exposed to a photogenerated acid and optionally during a post exposure baking process, providing a functionality capable of crosslinking with the crosslinker when the crosslinker is exposed to the photogenerated acid.

9. The photoresist composition of claim 2, wherein monomers (I), (II), (III) and (IV) are monomers with structure (V), (VI), (VII) or (VIII), respectively:

(V)

(VI)

(VII)

(VIII)

10. The photoresist composition of claim 9, wherein at least one of X or Y comprise:

wherein j, k, p, and q take the values in the following table:

| -alkyl- j | -aryl- k | —O— p | —COO— q |
|---|---|---|---|
| 1 | 1 | 1 | 1 |
| 1 | 1 | 0 | 1 |
| 1 | 1 | 1 | 0 |
| 1 | 0 | 0 | 1 |
| 1 | 0 | 1 | 0 |
| 0 | 1 | 1 | 1 |
| 0 | 1 | 0 | 1 |
| 0 | 1 | 1 | 0 |
| 0 | 0 | 0 | 1 | wherein alkyl is a branched or unbranched, substituted or unsubstituted, saturated or unsaturated divalent alkyl chain of 1-16 carbon atoms with or without one or more heteroatoms substituted into the chain, aryl is a substituted or unsubstituted aromatic group, a heteroaromatic group, or a fused aromatic or fused heteroaromatic group, and wherein ALPG is a leaving group.

11. The photoresist composition of claim 10, wherein ALPG is a tertiary alkyl or tertiary cycloalkyl group, an alicyclic group, a ketal or cyclic aliphatic ketal, or an acetal.

12. The photosensitive composition of claim 10, further comprising a solvent, wherein the solvent comprises an ester, an ether, an ether-ester, a hydroxy ester, a hydroxy ether, a ketone, a keto-ester, a hydrocarbon, an aromatic compound, a halogenated solvent, an alkyl-aryl ether or a combination thereof.

13. The photoresist composition of claim 10, wherein the acid-labile protecting group is capable of being removed when exposed to a photogenerated acid and optionally during a post exposure baking process, providing a functionality capable of crosslinking with the crosslinker when the crosslinker is exposed to the photogenerated acid.

* * * * *